(12) United States Patent
Watanabe et al.

(10) Patent No.: US 8,955,947 B2
(45) Date of Patent: Feb. 17, 2015

(54) PIEZOELECTRIC MATERIAL, PIEZOELECTRIC ELEMENT, LIQUID DISCHARGE HEAD, ULTRASONIC MOTOR, AND DUST REMOVING DEVICE

(75) Inventors: Takayuki Watanabe, Yokohama (JP); Shunsuke Murakami, Kawasaki (JP); Nobuhiro Kumada, Kofu (JP)

(73) Assignees: Canon Kabushiki Kaisha, Tokyo (JP); University of Yamanashi, Kofu-shi (JP)

(*) Notice: Subject to any disclaimer, the term of this patent is extended or adjusted under 35 U.S.C. 154(b) by 0 days.

(21) Appl. No.: 13/983,938

(22) PCT Filed: Feb. 27, 2012

(86) PCT No.: PCT/JP2012/055490
§ 371 (c)(1),
(2), (4) Date: Aug. 6, 2013

(87) PCT Pub. No.: WO2012/118213
PCT Pub. Date: Sep. 7, 2012

(65) Prior Publication Data
US 2013/0335488 A1  Dec. 19, 2013

(30) Foreign Application Priority Data
Feb. 28, 2011  (JP) ................. 2011-041881

(51) Int. Cl.
*B41J 2/045* (2006.01)
*H01L 41/187* (2006.01)
(Continued)

(52) U.S. Cl.
CPC ......... *H01L 41/1871* (2013.01); *B41J 2/14233* (2013.01); *C04B 35/495* (2013.01); *C04B 35/62685* (2013.01); *H01L 41/1873* (2013.01);
(Continued)

(58) Field of Classification Search
None
See application file for complete search history.

(56) References Cited

U.S. PATENT DOCUMENTS 7,944,126 B2  5/2011  Tanaka et al.
2002/0151430 A1  10/2002  Yamaguchi et al.
(Continued)

FOREIGN PATENT DOCUMENTS

EP  0 468 796 A1  1/1992
JP  2004-187384 A  7/2004
(Continued)

OTHER PUBLICATIONS

K. Zhu et al., Effects of CuO Doping on Properties of NaNbO2—BaTiO3 Lead free Piezoelectric Ceramics, 38(6), Journal of the Chinese Ceramic Society, 1031-1035 (Jun. 2010).*
(Continued)

*Primary Examiner* — Matthew Luu
*Assistant Examiner* — Erica Lin
(74) *Attorney, Agent, or Firm* — Fitzpatrick, Cella, Harper & Scinto

(57) ABSTRACT

Provided is a piezoelectric material which has satisfactory insulation property and piezoelectric property and which does not contain lead and potassium. The piezoelectric material includes a perovskite-type metal oxide that is represented by the following general formula (1):

$$(Na_xBa_{1-y})(Nb_yTi_{1-y})O_3 \qquad \text{General formula (1)}$$

where relationships of $0.80 \leq x \leq 0.95$ and $0.85 \leq y \leq 0.95$ are satisfied, and $y \times 0.05$ mol % or more to $y \times 2$ mol % or less of copper with respect to 1 mol of the perovskite-type metal oxide.

5 Claims, 5 Drawing Sheets (51) Int. Cl.
*B41J 2/14* (2006.01)
*C04B 35/495* (2006.01)
*C04B 35/626* (2006.01)
*H01L 41/43* (2013.01)
*H02N 2/00* (2006.01)
*H02N 2/10* (2006.01)
*H02N 2/16* (2006.01)

(52) U.S. Cl.
CPC ............... *H01L 41/43* (2013.01); *H02N 2/001* (2013.01); *H02N 2/106* (2013.01); *H02N 2/163* (2013.01); *C04B 2235/3201* (2013.01); *C04B 2235/3215* (2013.01); *C04B 2235/3236* (2013.01); *C04B 2235/3255* (2013.01); *C04B 2235/3267* (2013.01); *C04B 2235/3281* (2013.01); *C04B 2235/5445* (2013.01); *C04B 2235/768* (2013.01); *C04B 2235/77* (2013.01); *C04B 2235/80* (2013.01); *C04B 2235/81* (2013.01); *C04B 2235/96* (2013.01)
USPC .......................................................... 347/68

(56) References Cited

U.S. PATENT DOCUMENTS

| | | |
|---|---|---|
| 2007/0001553 A1 | 1/2007 | Kawada et al. |
| 2008/0112109 A1 | 5/2008 | Muto et al. |
| 2011/0143146 A1* | 6/2011 | Harigai et al. ............... 428/446 |

FOREIGN PATENT DOCUMENTS

| | | |
|---|---|---|
| JP | 2009-227535 A | 10/2009 |
| JP | 2010-120835 A | 6/2010 |
| WO | 2012/165643 A1 | 12/2012 |

OTHER PUBLICATIONS

K. Zhu et al., "Effects of CuO Dopping on Properties of NaNbO3—BaTiO3 Lead-Free Piezoelectric Ceramics," 38(6) Journal of the Chinese Ceramics Society 1031-1035 (Jun. 2010).

Office Action in Chinese Application No. 201280010706.5 (Dated Mar. 31, 2014).

J. T. Zeng et. al., "Ferroelectric and Piezoelectric Properties of Na1—xBaxNb1—xTixO3 Ceramics," 89(9) J. Am. Ceram. Soc. 2828-2832 (Jul. 2006) (XP009159648).

K. Zhu et al., "Effects of CuO Dopping on Properties of NaNbO3—BaTiO3 Lead-Free Piezoelectric Ceramics," 38(6) Journal of the Chinese Ceramics Society 1031-1035 (Abstract) (Jun. 2010) (XP002676534).

In-Tae Seo et al., "Effect of CuO on the Sintering and Piezoelectric Properties of 0.95(Na0.5K0.5)NbO3-0.05SrTiO3 Lead-Free Piezoelectric Ceramics," 91(12) J. Am. Ceram. Soc. 3955-3960 (2008).

Office Action in Korean Application No. 10-2013-7024664 (mailed Nov. 24, 2014).

\* cited by examiner

PIEZOELECTRIC MATERIAL, PIEZOELECTRIC ELEMENT, LIQUID DISCHARGE HEAD, ULTRASONIC MOTOR, AND DUST REMOVING DEVICE

TECHNICAL FIELD

The present invention relates to a piezoelectric material, and more particularly, to a lead-free piezoelectric material. The present invention also relates to a piezoelectric element, a liquid discharge head, an ultrasonic motor, and a dust removing device, which use the piezoelectric material.

BACKGROUND ART

Lead zirconate titanate containing lead is a representative piezoelectric material, and is used in a variety of piezoelectric devices such as an actuator, an oscillator, a sensor, and a filter. However, it has been pointed out that, when a piezoelectric device containing lead is once scrapped and exposed to acid rain, the lead content in the piezoelectric material may be transferred into the soil to adversely affect the ecosystem. Accordingly, in order to exclude lead from piezoelectric devices, research and development on lead-free piezoelectric materials are actively conducted.

In Non Patent Literature 1, it has been found that, by forming a solid solution of a small amount of barium titanate and sodium niobate which is an antiferroelectric, a ferroelectric is produced. Non Patent Literature 1 discloses remanent polarization, coercive field, piezoelectric constants, and electromechanical coupling coefficients of the solid solution in compositions in which the concentration of barium titanate is from 5% to 20%. This material does not contain lead, and in addition, does not contain potassium which is responsible for the difficulty in sintering and reduction in resistance to humidity. Further, it is also disclosed that the Curie temperature of this material is higher than the Curie temperature of barium titanate which is a representative lead-free ferroelectric material (120° C.). The Curie temperature of a composition $(Na_{0.9}Ba_{0.1})(Nb_{0.9}Ti_{0.1})O_3$ which may obtain the maximum piezoelectric constant $d_{33}=143$ pC/N is 230° C.

Patent Literature 1 discloses that, through the addition of cobalt to a solid solution of sodium niobate and barium titanate, the electromechanical coupling coefficient is improved and high heat resistance is obtained. On the other hand, Patent Literature 1 also discloses that such a sample was included that a polarization treatment was difficult because the insulation property was as low as $10^6 \Omega$ or less.

CITATION LIST

Non Patent Literature

NPL 1: "Journal of the American Ceramic Society", J. T. Zeng et. al., 2006, Volume 89, pp. 2828-2832

Patent Literature

PTL 1: Japanese Patent Application Laid-Open No. 2009-227535

SUMMARY OF INVENTION

Technical Problem

In the conventional technology, in order to improve the electromechanical coupling coefficient of a piezoelectric material obtained by forming a solid solution of barium titanate and sodium niobate (hereinafter, the piezoelectric material is referred to as NN-BT), it is necessary to use cobalt which is expensive and the hazardousness of which is pointed out. Further, there is a problem that the insulation resistance of cobalt-doped NN-BT is not always high.

Further, the inventors of the present invention have found the following problem as a result of diligent research on NN-BT. When NN-BT ceramics are sintered, sodium volatilizes from the sample. Therefore, the NN-BT ceramics after sintering is liable to be sodium-deficient. In a sodium-deficient sample, the insulation property was low, the polarization was pinned, the electromechanical coupling coefficient was low, and there were large fluctuations in piezoelectric performance among samples.

The present invention has been made to solve such problems, and provides a piezoelectric material which does not contain lead, potassium, and cobalt, which has a Curie temperature that is higher than that of barium titanate, and which has satisfactory insulation property and piezoelectric property. In addition, the present invention provides a piezoelectric element using the lead-free piezoelectric material, and a liquid discharge head, an ultrasonic motor, and a dust removing device which use the piezoelectric element.

Solution to Problem

In order to solve the above-mentioned problems, according to a first aspect of the present invention, there is provided a piezoelectric material including: a perovskite-type metal oxide that is represented by the following general formula (1):

$$(Na_xBa_{1-x})(Nb_yTi_{1-y})O_3 \qquad \text{General formula (1)}$$

where relationships of $0.80 \leq x \leq 0.95$ and $0.85 \leq y \leq 70.95$ are satisfied, and $y \times 0.05$ mol % or more to $y \times 2$ mol % or less of copper with respect to 1 mol of the perovskite-type metal oxide.

According to a second aspect of the present invention, there is provided a piezoelectric element including a first electrode, the piezoelectric material according to the first aspect of the present invention, and a second electrode.

According to a third aspect of the present invention, there is provided a liquid discharge head which uses the above-mentioned piezoelectric element.

According to a fourth aspect of the present invention, there is provided an ultrasonic motor which uses the above-mentioned piezoelectric element.

According to a fifth aspect of the present invention, there is provided a dust removing device which uses the above-mentioned piezoelectric element.

Advantageous Effects of Invention

According to the present invention, the piezoelectric material which does not contain lead, potassium, and cobalt, which has a Curie temperature that is higher than that of barium titanate, and which has satisfactory insulation property and piezoelectric property may be provided. The piezoelectric material according to the present invention does not use lead, and thus, the environmental load thereof is light. Further, the piezoelectric material according to the present invention does not use potassium, and thus is excellent in sintering performance and in resistance to humidity.

Further features of the present invention will become apparent from the following description of exemplary embodiments with reference to the attached drawings.

DESCRIPTION OF EMBODIMENTS

Embodiments for carrying out the present invention are described in the following.

The present invention provides a lead-free piezoelectric material which is based on NN-BT and which has satisfactory piezoelectric property and insulation property. Note that, the piezoelectric material of the present invention may be used in various applications such as a capacitor, a memory, and a sensor, utilizing its characteristics as a dielectric.

The piezoelectric material of the present invention includes y×0.05 mol % or more to y×2 mol % or less of copper with respect to 1 mol of a perovskite-type metal oxide represented by the following general formula (1):

$(Na_xBa_{1-y})(Nb_yTi_{1-y})O_3$    General formula (1)

where relationships of $0.80 \le x \le 0.95$ and $0.85 \le y \le 0.95$ are satisfied.

When the amount of copper added as a secondary component is less than y×0.05 mol %, the insulation resistance and the piezoelectric property are not satisfactorily improved. When the amount of copper added is more than y×2 mol %, an impurity phase occurs to lower the piezoelectric property.

The ranges of x and y in the general formula (1) satisfy $0.80 \le x \le 0.95$ and $0.85 \le y \le 0.95$, respectively.

When the niobium content y is less than 0.85, the Curie temperature becomes lower than 160° C. On the other hand, when the niobium content y is more than 0.95, the piezoelectric property is lowered. It follows that, when the niobium content y satisfies $0.85 \le y \le 0.95$, the Curie temperature is 160° C. or higher, and satisfactory piezoelectric property may be obtained. Further, when the niobium content y is within the range of $0.85 \le y \le 0.90$, Curie temperature is within the range of 160° C. to 240° C. Since NN-BT whose Curie temperature is within this temperature range can be easily poled, the niobium content, $0.85 \le y \le 0.90$, is preferable. When the niobium content y is within the range of $0.88 \le y \le 0.90$, Curie temperature is within the range of 190° C. to 240° C. This is more preferable because not only polarization treatment is easy but deterioration by heat in device manufacturing process is reduced.

When the sodium content x is less than 0.8, the sodium content is smaller than 95% of the niobium content. In a composition which is deficient in sodium by 5% or more, an impurity phase (phase having an X-ray diffraction pattern similar to that of $Ba_4Nb_2O_9$, $Ba_6Ti_7Nb_9O_{42}$, $Ba_3Nb_4Ti_4O_{21}$, $Ba_3Nb_{3.2}Ti_5O_{21}$, or the like) occurs to lower the insulation property of the sample. When the sodium content x is more than 0.95, the piezoelectric property is lowered. When the sodium content x satisfies $0.80 \le x \le 0.95$, the occurrence of an impurity phase can be suppressed to obtain satisfactory piezoelectric property. When x is less than y, copper is taken into crystal lattice and the effects of the present invention are likely to be produced. Therefore, it is preferable that x is less than y.

Herein, the Curie temperature refers to not only the Curie temperature estimated according to the Curie-Weiss law but also a temperature at which the dielectric constant becomes a local maximum in the vicinity of a phase transition temperature between a ferroelectric phase and a paraelectric phase.

Herein, the perovskite structure is the name of a crystal structure generally represented by chemical formula of $ABO_3$. The elements A and B occupy specific positions in a unit cell, which are called A site and B site. In the case of a cubic perovskite structure, the A site element occupies the eight corners of a unit cell, the B site element occupies one body-centered position, and oxygen occupies the six face-centered positions. The coordination number of the A site element is 12 while the coordination number of the B site element is 6.

Copper may be present at the A site or B site of the perovskite structure and may be present at both the A site and the B site. Further, Copper may be present at grain boundary. When sodium niobate or a crystal containing sodium niobate as a component is sintered, sodium may sometimes be vaporized or diffused and the composition of the sample after the sintering becomes deficient in sodium with respect to niobium. Specifically, a defect occurs at the A site. Therefore, it is preferred that a part of copper added occupy the A site to compensate for the defect.

When copper occupies the A site to reduce the crystal defect, at least one of the following effects may be expected:
(1) the increase in resistivity;
(2) the increase in phase inversion angle of the impedance at the resonance frequency of the piezoelectric material that is subjected to polarization treatment;
(3) the increase in remanent polarization value evaluated by polarization-electric field hysteresis loop measurement;
(4) the increase in electromechanical coupling coefficient or piezoelectric constant;
(5) the decrease in mechanical quality factor;
(6) the decrease in Young's modulus; and
(7) the decrease in dissipation factor (tan δ).

When copper occupies the B site, copper and an oxygen defect form a defect dipole, and an internal field is formed. Therefore, it is preferable that a part of added copper occupies the B site.

When copper occupies the B site, at least one of the following effects may be expected:
(1) the reduction in electromechanical coupling coefficient or piezoelectric constant;
(2) the increase in mechanical quality factor;
(3) the increase in Young's modulus; and
(4) the internal field is present.

Magnitude of the internal field is a half of difference of magnitude of positive and negative coercive fields obtained by measurements of polarization-electric field hysteresis loops. When the internal field is smaller than the coercive field, it is difficult to estimate the magnitude of the internal field in non-poled ceramics by the hysteresis loops measurements. This is because the defect polarization orients randomly in the non-poled ceramics. Therefore, a sample having been subjected to polarization treatment may be used for estimating the internal field intensity, because the defect polarization is poled by the polarization treatment as well as a spontaneous polarization.

When copper occupy both the A site and the B site, the above effects are superimposed. Since the superimposed effects may be controlled by the amount of copper, it is more preferable that copper is contained at both the A site and the B site.

When copper occupies the A site, the volume of the unit cell is decreased because copper ions are smaller than sodium ions.

When copper occupies the B site, the volume of the unit cell is increased because copper ions are larger than niobium ions. The volume of the unit cell may be evaluated by X-ray diffraction.

For example, when copper first occupies the A site and then occupies the B site, the volume of the unit cell is once decreased and then increased.

Of course, it is not necessary that the whole copper added be at any one of the A site and the B site. As long as a polarization treatment can be carried out, it is not essential that copper is contained at either or both the A site and the B site. It is preferable that copper is present at grain boundary, since sintering process is promoted. The site occupied by copper may also be evaluated by precise X-ray diffraction, Raman scattering, or transmission electron microscope.

For the purpose of facilitating manufacture of the piezoelectric material of the present invention and adjusting the physical properties of the piezoelectric material of the present invention, part of barium may be substituted by a divalent metallic element at the range of not more than 20%, for example, strontium or calcium. Similarly, part of niobium may be substituted by a pentavalent metallic element at the range of not more than 20%, for example, tantalum or vanadium.

The form of the piezoelectric material of the present invention may be single crystal or a sintered body, or may be a film formed on a substrate.

In manufacturing a sintered body of the piezoelectric material of the present invention, powder or liquid of a metal oxide or a metallic salt may be used as a raw material. However, as described above, a deficiency of sodium may occur in the process of the sintering. Therefore, sodium may be excessive to some extent when powder of the raw materials is weighed.

Further, barium titanate powder and sodium niobate powder may be used as the raw materials. A compact used in the subsequent sintering process may be formed any of by metallic molding, casting, and sheet molding.

A compact may be sintered in air or a reducing atmosphere. As a sintering method, in addition to normal sintering furnace, spark plasma sintering, microwave sintering, millimeter wave sintering, or hot isostatic pressing may be employed.

When the crystal grain size of the piezoelectric material of the present invention exceeds 100 μm, the strength may be poor in cutting and polishing. On the other hand, when the crystal grain size is less than 0.3 μm, piezoelectric property is lowered. Therefore, a preferred average grain size is in a range of 0.3 μm or more to 100 μm or less.

When the piezoelectric material of the present invention is used as a film formed on a substrate, it is desired that the thickness of the piezoelectric material be 200 nm or more to 10 μm or less, more preferably 300 nm or more to 3 μm or less. This is because, when the thickness of the piezoelectric material is 200 nm or more to 10 μm or less, a sufficient electromechanical converting function as a piezoelectric element may be obtained.

The method of laminating the above-mentioned film is not particularly limited. For example, chemical solution deposition (CSD), a sol-gel process, metalorganic chemical vapor deposition (MOCVD), sputtering, pulsed laser deposition (PLD), hydrothermal synthesis, or aerosol deposition (AD) may be used. Among them, chemical solution deposition or sputtering is the most preferred laminating method. By chemical solution deposition or sputtering, the area of a film formed may be increased with ease.

It is preferred that the substrate used for the piezoelectric material of the present invention be a single crystal substrate which is cut and polished along a (001)plane or a (110)plane. With the use of a single crystal substrate which is cut and polished along a specific crystal face, a piezoelectric material film provided on the surface of the substrate may strongly orient in the same direction.

Hereinafter, a piezoelectric element using the piezoelectric material of the present invention is described.

The piezoelectric element according to the present invention is a piezoelectric element including at least a first electrode, a piezoelectric material, and a second electrode, and the piezoelectric material is the above-mentioned piezoelectric material.

The first electrode and the second electrode are each formed of a conductive layer having a thickness of about 5 nm to 2,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, Ag, and Cu, and oxides of these metals. Each of the first electrode and the second electrode may be formed of one kind of those materials, or may be obtained by laminating two or more kinds thereof. The first electrode and the second electrode may be formed of different materials.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

Figure 1A:
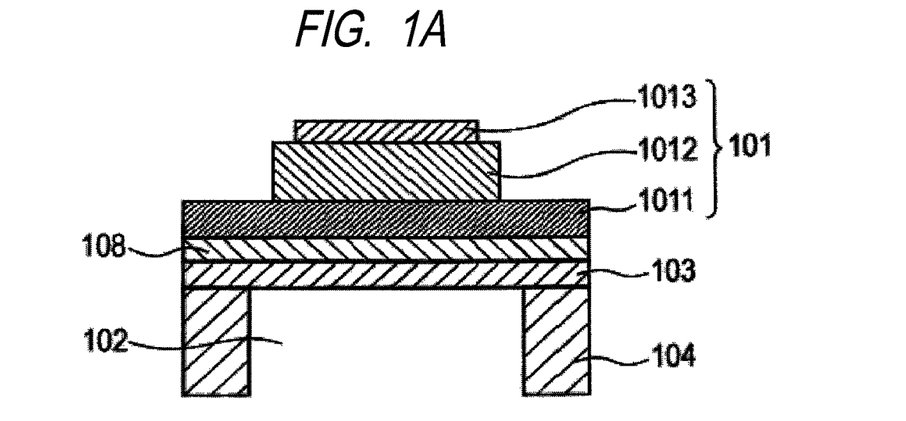
FIGS. 1A and 1B are schematic diagrams illustrating a structure of a liquid discharge head according to an embodiment of the present invention.
Figure 1B:
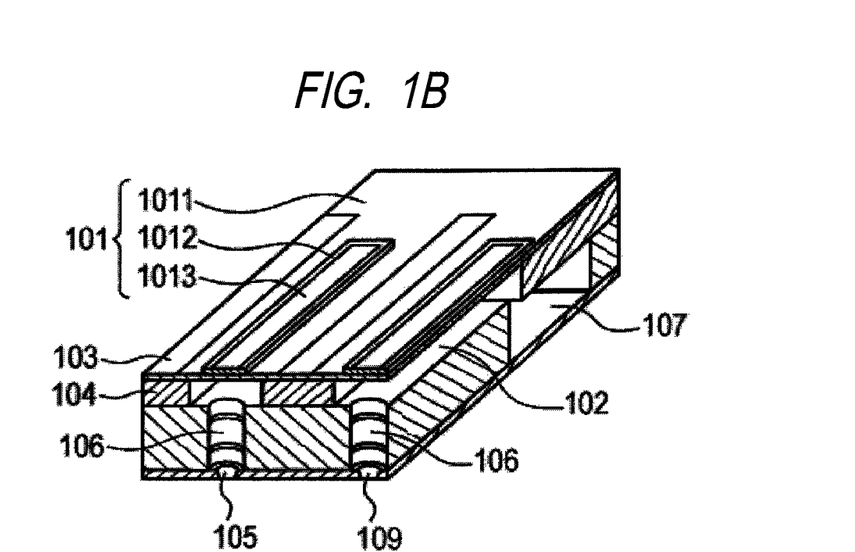

FIGS. 1A and 1B are schematic views illustrating a structure of a liquid discharge head according to an embodiment of the present invention. As illustrated in FIGS. 1A and 1B, the liquid discharge head of the present invention is a liquid discharge head including a piezoelectric element 101 of the present invention. The piezoelectric element 101 is a piezoelectric element including at least a first electrode 1011, a piezoelectric material 1012, and a second electrode 1013. The piezoelectric material 1012 is patterned as required as illustrated in FIG. 1B.

FIG. 1B is a schematic view of the liquid discharge head. The liquid discharge head includes discharge ports 105, individual liquid chambers 102, connecting holes 106 for connecting the individual liquid chambers 102 and the discharge ports 105, liquid chamber partition walls 104, a common liquid chamber 107, a diaphragm 103 which is a vibration portion, and the piezoelectric elements 101. Each of the piezoelectric elements 101, which has a rectangular shape in FIG. 1B, may have a shape except the rectangular shape such as an elliptical shape, a circular shape, or a parallelogram shape. In general, the piezoelectric material 1012 has a shape in conformity with the shape of the individual liquid chamber 102.

The vicinity of the piezoelectric element 101 included in the liquid discharge head of the present invention is described in detail with reference to FIG. 1A. FIG. 1A is a sectional view of the piezoelectric element in the width direction of the liquid discharge head illustrated in FIG. 1B. The sectional shape of the piezoelectric element 101, which is illustrated in a rectangular shape, may be a trapezoidal shape or a reverse trapezoidal shape.

In FIG. 1A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode.

Note that, those differences in name depend on a manufacturing method for the device and an effect of the present invention can be obtained in any case.

In the liquid discharge head, the diaphragm 103 vertically fluctuates owing to the expansion and contraction of the piezoelectric material 1012 to apply a pressure to liquid in the individual liquid chamber 102. As a result, the liquid is discharged from the discharge port 105. The liquid discharge head of the present invention can be used in a printer application or the manufacture of an electronic device.

The diaphragm 103 has a thickness of 1.0 μm or more to 15 μm or less, preferably 1.5 μm or more to 8 μm or less. A material for the diaphragm, which is not limited, is preferably Si. Si for the diaphragm may be doped with boron or phosphorous. In addition, the buffer layer and the electrode layer on the diaphragm may serve as part of the diaphragm.

The buffer layer 108 has a thickness of 5 nm or more to 300 nm or less, preferably 10 nm or more to 200 nm or less.

The size of the discharge port 105 is 5 μm or more to 40 μm or less in terms of an equivalent circular diameter. The shape of the discharge port 105 may be a circular shape, or may be a star shape, a square shape, or a triangular shape.

Next, an ultrasonic motor using the piezoelectric element of the present invention is described.

Figure 2A:
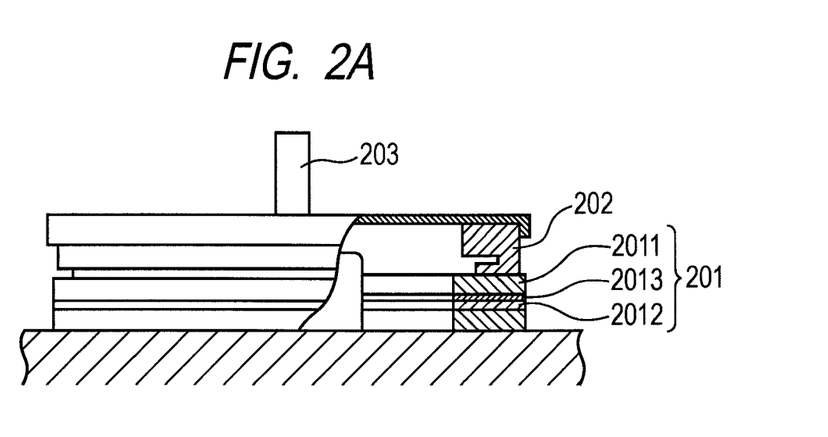
FIGS. 2A and 2B are schematic diagrams illustrating a structure of an ultrasonic motor according to an embodiment of the present invention.
Figure 2B:
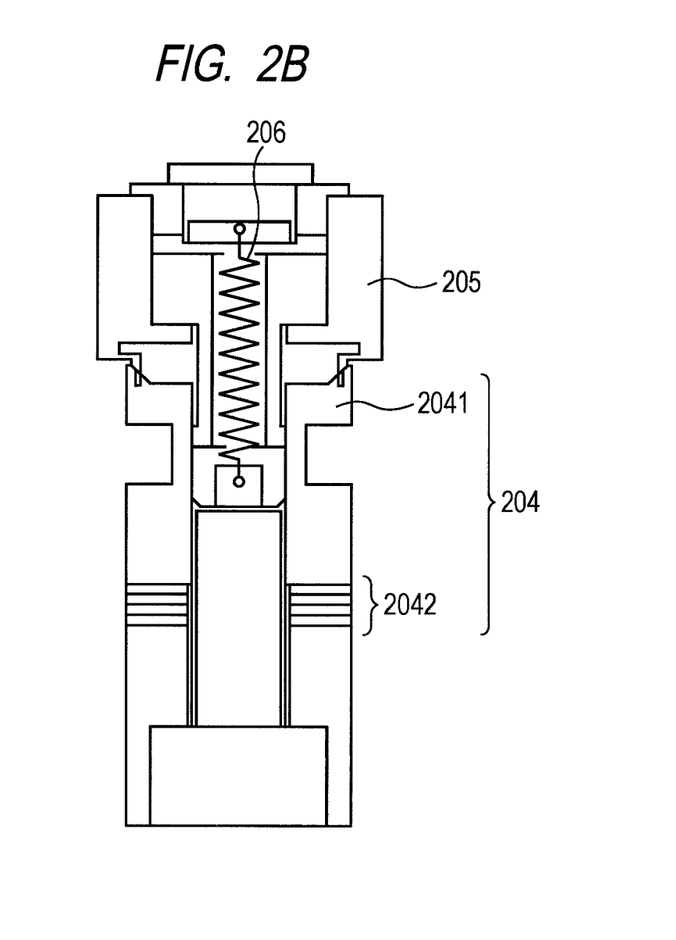

FIGS. 2A and 2B are schematic views illustrating a structure of the ultrasonic motor according to an embodiment of the present invention.

FIG. 2A illustrates an ultrasonic motor in which the piezoelectric element of the present invention is formed of a single plate. The ultrasonic motor includes a transducer 201 which is a vibration body, a rotor 202, which is a moving body, brought into contact with the sliding surface of the transducer 201 by virtue of a pressure applied from a pressurizing spring (not shown), and an output axis 203 provided so as to be integral with the rotor 202. The transducer 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric material interposed between a first electrode (not shown) and a second electrode (not shown).

The application of two alternating voltages different from each other in phase by π/2 to the piezoelectric element of the present invention results in the generation of a bending travelling wave in the transducer 201, and hence each point on the sliding surface of the transducer 201 undergoes an elliptical motion. When the rotor 202 is brought into press contact with the sliding surface of the transducer 201, the rotor 202 receives a frictional force from the transducer 201 to rotate in the direction opposite to the bending travelling wave. A body to be driven (not shown) is joined to the output axis 203, and is driven by the rotary force of the rotor 202.

The application of a voltage to the piezoelectric material results in the expansion and contraction of the piezoelectric material due to a piezoelectric transverse effect. When an elastic body such as a metal is joined to the piezoelectric element, the elastic body is bent by the expansion and contraction of the piezoelectric material. The ultrasonic motor of the kind described here utilizes the principle.

Next, an ultrasonic motor including a piezoelectric element having a laminated structure is described with reference to FIG. 2B. A transducer 204 is formed of a laminated piezoelectric element 2042 interposed between tubular metal elastic bodies 2041. The laminated piezoelectric element 2042 is an element formed of multiple laminated piezoelectric materials (not shown), and includes a first electrode and a second electrode on its outer surface of lamination, and inner electrodes on its inner surface of lamination. The metal elastic bodies 2041 are fastened with bolts so that the piezoelectric element 2042 may be interposed between and fixed by the bodies. Thus, the transducer 204 is formed.

The application of alternating voltages different from each other in phase to the piezoelectric element 2042 causes the transducer 204 to excite two vibrations orthogonal to each other. The two vibrations are combined to form a circular vibration for driving the tip portion of the transducer 204. Note that, a constricted circumferential groove is formed in the upper portion of the transducer 204 to enlarge the displacement of the vibration for driving.

A rotor 205 is brought into contact with the transducer 204 under a pressure from a spring 206 for pressurization to obtain a frictional force for driving. The rotor 205 is rotatably supported by a bearing.

Next, a dust removing device using the piezoelectric element of the present invention is described.

Figure 3A:
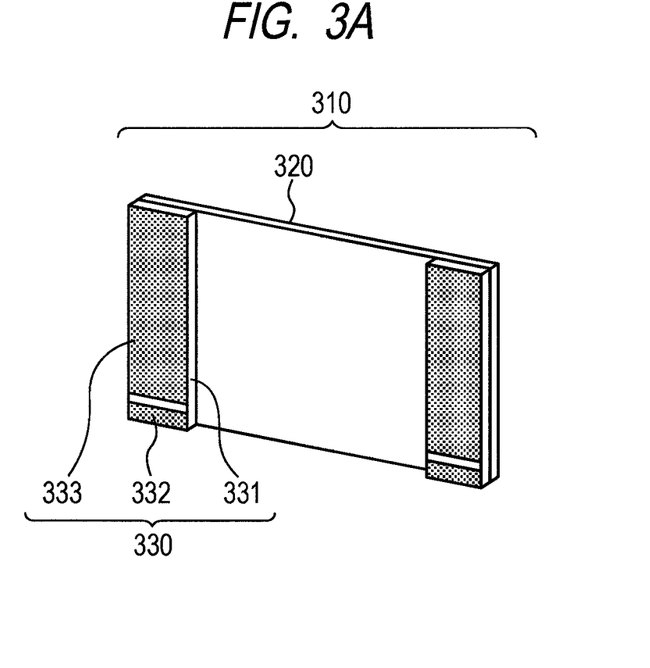
FIGS. 3A and 3B are schematic diagrams illustrating a structure of a dust removing device according to an embodiment of the present invention.
Figure 3B:
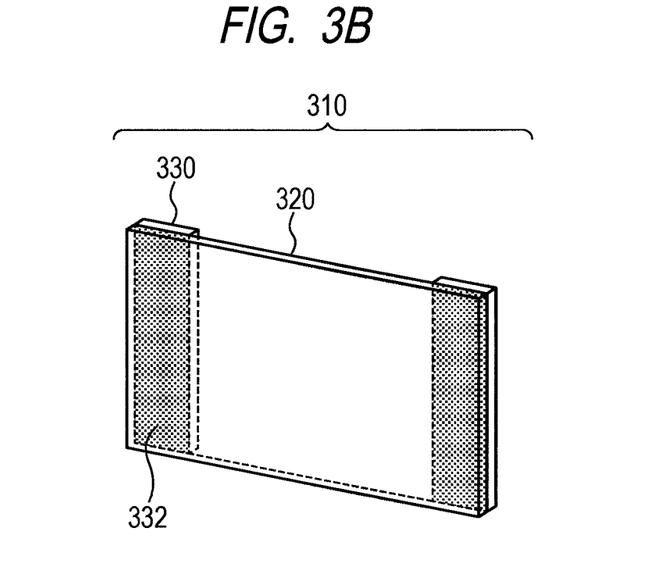

FIGS. 3A and 3B are schematic diagrams illustrating a structure of the dust removing device according to an embodiment of the present invention. A dust removing device 310 includes a plate-like piezoelectric element 330 and a diaphragm 320. The material of the diaphragm 320 is not limited. In the case where the dust removing device 310 is used for an optical device, a transparent material or a reflective material can be used as the material of the diaphragm 320.

Figure 4A:
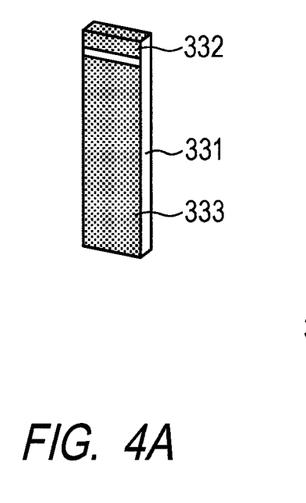
FIGS. 4A, 4B, and 4C are schematic diagrams illustrating electrodes of the dust removing device according to the embodiment of the present invention.
Figure 4B:
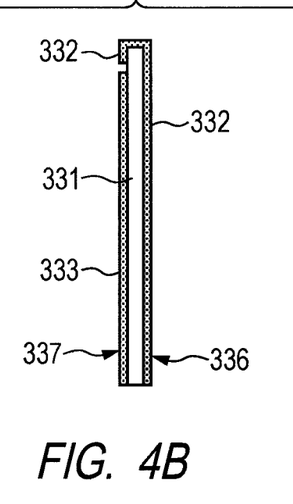
Figure 4C:
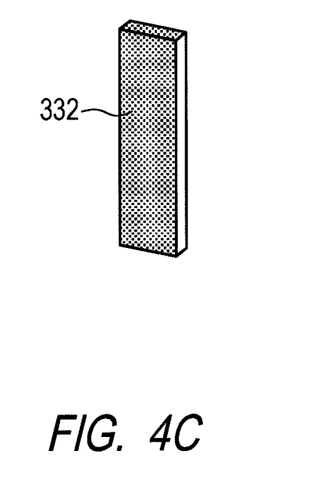

FIGS. 4A to 4C are schematic diagrams illustrating a structure of the piezoelectric element 330 illustrated in FIGS. 3A and 3B. FIGS. 4A and 4C illustrate a front surface structure and a rear surface structure of the piezoelectric element 330, respectively. FIG. 4B illustrates a side surface structure. As illustrated in FIGS. 4A to 4C, the piezoelectric element 330 includes a piezoelectric material 331, a first electrode 332, and a second electrode 333. The first electrode 332 and the second electrode 333 are disposed so as to be opposed to the plate surfaces of the piezoelectric material 331. In FIG. 4C, the front surface of the piezoelectric element 330 on which the first electrode 332 is disposed is referred to as a first electrode surface 336. In FIG. 4A, the front surface of the piezoelectric element 330 on which the second electrode 333 is disposed is referred to as a second electrode surface 337.

The electrode surface as used in the present invention means a surface of the piezoelectric element on which the electrode is disposed. For instance, as illustrated in FIGS. 4A to 4C, the first electrode 332 may extend around to the second electrode surface 337.

As illustrated in FIGS. 3A and 3B, as for the piezoelectric element 330 and the diaphragm 320, the plate surface of the diaphragm 320 is fixed to the first electrode surface 336 of the piezoelectric element 330. When the piezoelectric element 330 is driven, a stress is generated between the piezoelectric element 330 and the diaphragm 320, so that out-of-plane vibration is generated in the diaphragm. The dust removing device 310 of the present invention is a device that removes foreign matters such as dust sticking to the surface of the diaphragm 320 by the out-of-plane vibration of the diaphragm 320. The out-of-plane vibration means elastic vibration in which the diaphragm moves in the optical axis direction, namely in the thickness direction of the diaphragm.

Figure 5A:
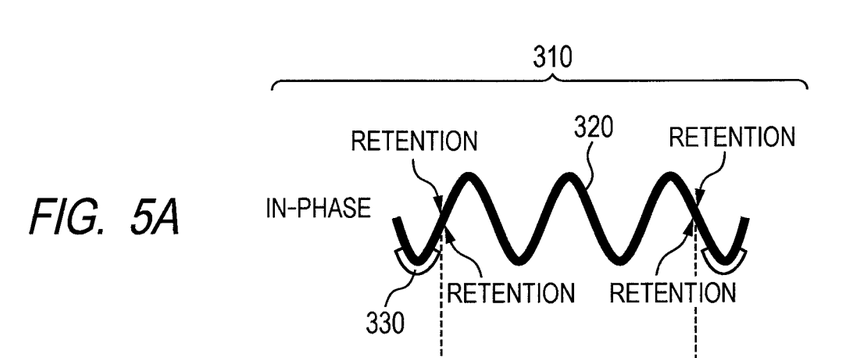
FIGS. 5A and 5B are schematic diagrams illustrating the principle of vibration of the dust removing device of the present invention.
Figure 5B:
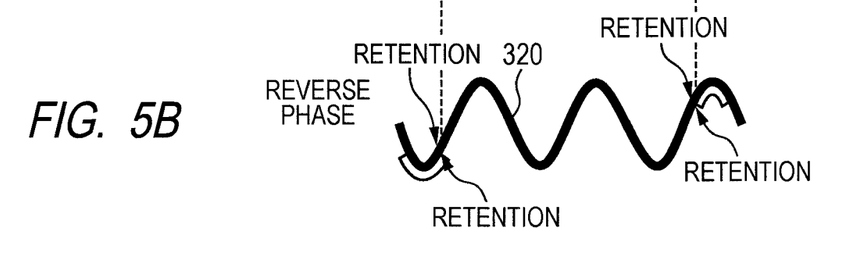

FIGS. 5A and 5B are schematic diagrams illustrating a vibration principle of the dust removing device 310 of the present invention. FIG. 5A illustrates a state in which alternating electric fields having the same phase are applied to a pair of left and right piezoelectric elements 330 so that the out-of-plane vibration is generated in the diaphragm 320. The polarization direction of the piezoelectric material forming the pair of left and right piezoelectric elements 330 is the same as the thickness direction of the piezoelectric elements 330, and the dust removing device 310 is driven by the seventh vibrational mode. FIG. 5B illustrates a state in which alternating voltages having opposite phases by 180° are applied to the pair of left and right piezoelectric elements 330 so that the out-of-plane vibration is generated in the diaphragm 320. The dust removing device 310 is driven by the sixth vibrational mode. The dust removing device 310 of the present invention is a device that can effectively remove dust sticking to the surface of the diaphragm by using at least two vibrational modes selectively.

As described above, the piezoelectric element of the present invention is suitably applicable to the liquid discharge head, the ultrasonic motor, and the dust removing device.

Through the use of the lead-free piezoelectric material represented by the general formula (1) of the present invention, it is possible to provide the liquid discharge head having nozzle density and discharge capacity which are the same as or higher than those in a case where a piezoelectric material containing lead is used.

Through the use of the lead-free piezoelectric material represented by the general formula (1) of the present invention, it is possible to provide the ultrasonic motor having driving force and durability which are the same as or higher than those in a case where a piezoelectric material containing lead is used.

Through the use of the lead-free piezoelectric material represented by the general formula (1) of the present invention, it is possible to provide the dust removing device having dust-removing efficiency which is the same as or higher than that in a case where a piezoelectric material containing lead is used.

The piezoelectric material of the present invention can be used in such a device as an ultrasonic transducer, a piezoelectric actuator, a piezoelectric sensor, and a ferroelectric memory, as well as the liquid discharge head and the motor.

Hereinafter, the piezoelectric material of the present invention is described more specifically by way of examples. However, the present invention is not limited by the following examples.

A sintered body obtained by each of the procedures was evaluated by the following standardized procedure.

The density of the sintered body was evaluated by Archimedes method. The constituent phase and the lattice constant of the sintered body were evaluated by X-ray diffraction. Before the X-ray diffraction measurement, the sintered body was polished so that the thickness was about 0.5 mm. X-ray diffraction was carried out on the polished sintered body or powder obtained by crushing the polished sintered body to evaluate the constituent phase and the lattice constant.

Further, in order to remove an organic component on the surface, the polished sintered body was heat-treated at 400 to 1,000° C. in the air for 1 hour. Then, gold electrodes were formed on a front surface and a rear surface of the sintered body by DC sputtering. After that, the sample was processed in strips and then various kinds of electrical characteristics were evaluated. Resistivity was measured by a semiconductor parameter analyzer. A direct current voltage with an amplitude of a few tens to 100 volts was applied to the sample and resistance after 30 seconds from the start of voltage application was measured. The resistivity was calculated from the measured resistance and the sample size.

In order to evaluate the piezoelectric property, the sample was subjected to polarization treatment. Specifically, the sample was heated in an oil bath to a temperature of 150° C., and a voltage of 20 to 30 kV/cm was applied to the sample for 30 minutes, followed by cooling to room temperature with the voltage remaining to be applied thereto.

The Young's modulus ($Y_{11}$), the electromechanical coupling coefficient ($k_{31}$), the piezoelectric constant ($d_{31}$), and the mechanical quality factor ($Q_m$) of the piezoelectric material were evaluated by a resonance-antiresonance method on a $d_{31}$ element formed in the shape of a strip. The piezoelectric constant ($d_{33}$) was evaluated by Berlin court.

Comparative Examples 1, 2, and 4

As the raw materials, sodium carbonate ($Na_2CO_3$) powder, niobium oxide ($Nb_2O_5$) powder, and barium titanate ($BaTiO_3$) powder were used. The barium titanate powder was a commercially available product having a grain size of 100 nm (manufactured by Sakai Chemical Industry Co., Ltd. under the trade name of BT01). When NN-BT was synthesized, in the case where the raw materials were weighed so that the molar ratio of sodium to niobium was 1:1, there were some cases where an impurity phase having a diffraction pattern which was similar to that of at least one of $Ba_4Nb_2O_9$ (ICDD35-1154), $Ba_6Ti_7Nb_9O_{42}$ (ICDD47-0522), $Ba_3Nb_4Ti_4O_{21}$ (ICDD70-1150), and $Ba_3Nb_{3.2}Ti_5O_{21}$ (ICDD33-0170) was detected from the sample after sintering. Therefore, for Comparative Examples 1, 2, and 4, sodium was weighed to be excessive by 3% with respect to the target composition. This remarkably suppressed the occurrence of an impurity phase. Curie temperatures of the samples in Comparative Examples 1, 2 and 4 were 160° C., 190° C. and 240° C., respectively.

The raw materials were weighed and mixed so that a target composition $Na_{1-x}Ba_xNb_{1-x}Ti_xO_3$ (x=0.1, 0.12, or 0.15) was obtained. The mixed powder was calcined at 1,000 to 1,100° C. in the air for 2 to 5 hours. The calcined powder was crushed, and a PVB binder of 3 wt % with respect to the weight of powder was added thereto, followed by granulation. Granulated powder was filled in a mold and was compressed to obtain a compact having a diameter of 17 mm and a thickness of about 1 mm. By sintering the obtained compact at 1,200 to 1,300° C. in the air for 2 to 6 hours, the sintered body was obtained.

By the X-ray diffraction, it was confirmed that the sample had almost a single-phase perovskite structure. The composition of the sintered body was evaluated by inductively coupled plasma (ICP), and sodium was lacking with respect to the target composition up to 3%.

Examples 1 to 8

The sample was manufactured in methods similar to those of Comparative Examples 1, 2, and 4. However, when the raw materials were weighed and mixed, 0.1 mol %, 0.25 mol %, 0.5 mol %, 0.75 mol %, 1 mol %, or 2 mol % of copper oxide (CuO) powder was added per mol of niobium. By the X-ray diffraction, it was confirmed that the sintered body had a single-phase perovskite structure.

The composition of the obtained sintered body was analyzed by ICP. Sodium was lacking with respect to the target composition up to 5%.

Table 1 shows target compositions and various kinds of characteristics of the sintered bodies of Examples 1 to 8 and Comparative Examples 1, 2, and 4, which were manufactured using sodium carbonate powder, niobium oxide powder, barium titanate powder, and copper oxide powder as the raw materials.

By adding copper, the fluctuations in piezoelectric property among the samples were considerably reduced, and the standard deviation of the piezoelectric constant was decreased by 88%.

Change in Curie temperature of 20° C. or more by addition of copper was not observed. Lattice constant of NN-BT which copper was added varied larger or smaller when addition amount of copper changed from 0 mol % to 2 mol % of niobium. That is, copper occupies the A site or the B site of NN-BT, or both the A site and the B site of NN-BT.

Comparative Example 3

The sample was manufactured in method similar to that of Example 4. Note that manganese dioxide ($MnO_2$) was used

TABLE 1

| | | Target Composition | Density ($g/cm^3$) | Resistivity ($G\Omega cm$) | Young's Modulus Y11 (GPa) | Electromechanical Coupling Coefficient k31(—) | Piezoelectric Constant d31 (pm/V) | Mechanical Quality Factor Qm(—) | Piezoelectric Constant d33 (pm/V) |
|---|---|---|---|---|---|---|---|---|---|
| Comparative Example | 1 | $0.85NaNbO_3 + 0.15BaTiO_3$ | 4.57 | 45 | 132 | 0.158 | 41.6 | 288 | 122 |
| Example | 1 | $0.85(NaNbO_3 + 0.0075CuO) + 0.15BaTiO_3$ | 4.53 | 54 | 129 | 0.169 | 42.7 | 368 | 136 |
| Comparative Example | 2 | $0.88NaNbO_3 + 0.12BaTiO_3$ | 4.52 | 5 | 127 | 0.157 | 43.2 | 277 | 120 |
| Example | 2 | $0.88(NaNbO_3 + 0.001CuO) + 0.12BaTiO_3$ | 4.5 | 1077 | 125 | 0.187 | 49.7 | 281 | 145 |
| Example | 3 | $0.88(NaNbO_3 + 0.0025CuO) + 0.12BaTiO_3$ | 4.53 | 187 | 126 | 0.193 | 52.7 | 250 | 151 |
| Example | 4 | $0.88(NaNbO_3 + 0.005CuO) + 0.12BaTiO_3$ | 4.49 | 25 | 129 | 0.185 | 48.5 | 386 | 147 |
| Example | 5 | $0.88(NaNbO_3 + 0.0075CuO) + 0.12BaTiO_3$ | 4.59 | 19 | 132 | 0.191 | 50.8 | 330 | 142 |
| Example | 6 | $0.88(NaNbO_3 + 0.01CuO) + 0.12BaTiO_3$ | 4.58 | 27 | 132 | 0.181 | 47.7 | 415 | 136 |
| Example | 7 | $0.88(NaNbO_3 + 0.02CuO) + 0.12BaTiO_3$ | 4.59 | 22 | 132 | 0.178 | 46.2 | 443 | 130 |
| Comparative Example | 3 | $0.88(NaNbO_3 + 0.005MnO_2) + 0.12BaTiO_3$ | 4.42 | 16 | 118 | 0.154 | 42.7 | 278 | 112 |
| Comparative Example | 4 | $0.9NaNbO_3 + 0.1BaTiO_3$ | 4.45 | 113 | 121 | 0.179 | 49.1 | 176 | 145 |
| Example | 8 | $0.9(NaNbO_3 + 0.0075CuO) + 0.1BaTiO_3$ | 4.44 | 32 | 121 | 0.192 | 53.0 | 237 | 159 |

Table 1 shows the density, the resistivity, the Young's modulus ($Y_{11}$), the electromechanical coupling coefficient ($k_{31}$), the piezoelectric constant ($d_{31}$), the mechanical quality factor ($Q_m$), and the piezoelectric constant ($d_{33}$) with respect to the samples.

From Table 1, it is found that, by adding copper to NN-BT, the electromechanical coupling coefficient, the piezoelectric constant, and the mechanical quality factor were increased. From comparisons between Comparative Example 1 and Example 1 and between Comparative Example 2 and Examples 2 to 7, it is found that, by adding copper, the resistivity was also improved.

By adding copper, the phase angle of the impedance in a resonant state, which was a barometer of the extent of the polarization, was increased by about 20° at the maximum.

Figure 6:
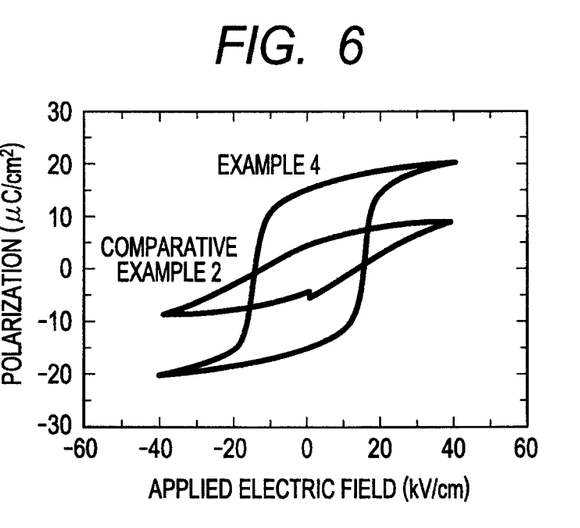
FIG. 6 illustrates polarization-electric field hysteresis loops of a piezoelectric material of Example 4 of the present invention and of a sintered body of Comparative Example 2.

FIG. 6 illustrates polarization-electric field hysteresis loops. Compared with the sample in which copper was not added, the sample in which copper was added showed a larger remanent polarization value, which indicates that polarization pinning was eliminated.

The increase in the phase angle and the increase in the remanent polarization indicate that, by adding copper, defects in the crystal were decreased and switching of spontaneous polarization became easier.

instead of copper oxide powder. From the X-ray diffraction, it was found that the sintered body was single phase of perovskite structure. Polarization switching property of NN-BT which manganese was added was similar to that of Example 4 (FIG. 6). That is, it was found that not only copper but manganese has the effect that polarization pinning is eliminated. Further, it was found that manganese improves resistivity (Table 1). However, the sample manganese was added had low density and low mechanical quality factor.

Comparative Example 5

Barium titanate powder and sodium niobate powder having a grain size of about 100-200 nm and were weighed and mixed so that a target composition $Na_{1-x}Ba_xNb_{1-x}Ti_xO_3$ (x=0.12) was obtained. The mixed powder was calcined at 900 to 1,100° C. in the air for 2 to 5 hours. The calcined powder was crushed, and a binder was added thereto, followed by granulation. Granulated powder was filled in a mold and was compressed to manufacture a compact having a diameter of 17 mm and a thickness of about 1 mm. By sintering the obtained compact at 1,100 to 1,300° C. in the air for 2 to 6 hours, the sintered body was obtained. The molar ratio of sodium to niobium in the obtained sintered body was analyzed by ICP. Sodium was lacking with respect to the target composition up to 2%. The ratio of barium and titanium was about 1:1.

Examples 9 to 12

The sample was manufactured in methods similar to that of Comparative Example 5. However, when the raw materials were weighed and mixed, 0.5 mol %, 0.75 mol %, 1 mol %, or 1.5 mol % of copper oxide powder with respect to niobium was added. By the X-ray diffraction, it was confirmed that the sample had a single-phase perovskite structure.

The molar ratio of sodium to niobium in the obtained sintered body was analyzed by ICP. Sodium was lacking with respect to the target composition up to 4%.

TABLE 2

| | Target Composition | Density (g/cm$^3$) | Resistivity (GΩcm) | Young's Modulus Y11 (GPa) | Electromechanical Coupling Coefficient k31(—) | Piezoelectric Constant d31 (pm/V) | Mechanical Quality Factor Qm(—) | Piezoelectric Constant d33 (pm/V) |
|---|---|---|---|---|---|---|---|---|
| Comparative Example 5 | 0.88NaNbO$_3$ + 0.12BaTiO$_3$ | 4.47 | 37 | 94 | 0.087 | 22.3 | 375 | 114 |
| Example 9 | 0.88(NaNbO$_3$ + 0.005CuO) + 0.12BaTiO$_3$ | 4.60 | 821 | 142 | 0.185 | 44.5 | 657 | 143 |
| Example 10 | 0.88(NaNbO$_3$ + 0.0075CuO) + 0.12BaTiO$_3$ | 4.57 | 739 | 141 | 0.170 | 40.2 | 662 | 134 |
| Example 11 | 0.88(NaNbO$_3$ + 0.01CuO) + 0.12BaTiO$_3$ | 4.56 | 507 | 135 | 0.162 | 42.3 | 418 | 128 |
| Example 12 | 0.88(NaNbO$_3$ + 0.015CuO) + 0.12BaTiO$_3$ | 4.34 | 118 | 113 | 0.146 | 40.2 | 384 | 133 |

Table 2 shows the density, resistivity, the Young's modulus ($Y_{11}$), the electromechanical coupling coefficient ($k_{31}$), the piezoelectric constant ($d_{31}$), the mechanical quality factor ($Q_m$), and the piezoelectric constant ($d_{33}$).

From Table 2, it is found that, by adding copper to NN-BT, the resistivity, the electromechanical coupling coefficient, the piezoelectric constant, and the mechanical quality factor were increased. Density increased when the added copper was 1 mol % or less with respect to niobium and decreased when added copper was 1.5 mol % with respect to niobium (Example 12). Dissipation factor measured at frequency of 1 kHz was about 1.4% in Comparative Example 5 in which copper was not added. On the other hand, dissipation factors in Examples 9 and 10 were lowered to the range of 0.5% or more to 1% or less. Dissipation factor in Example 12 was about 1.8%. Measurements of polarization-electric field hysteresis loops were conducted for the samples in Comparative Example 5 and Example 9 after the poling treatment. The internal fields estimated from the hysteresis loops were about 0.3 kV/cm and 1.7 kV/cm, respectively. By adding copper, the internal fields of the samples increased. As a result, mechanical quality factor increased.

Example 13

Through the use of the same piezoelectric material as in Example 4, a liquid discharge head illustrated in FIGS. 1A and 1B was prepared. Ink discharge from the liquid discharge head in response to input electric signals was confirmed.

Example 14

Through the use of the same piezoelectric material as in Example 4, an ultrasonic motor illustrated in FIGS. 2A and 2B was prepared. The rotary behavior of the motor in response to application of an alternating voltage was confirmed.

Example 15

Through the use of the same piezoelectric material as in Example 4, a dust removing device illustrated in FIGS. 3A and 3B was prepared. When an alternating voltage was applied after spraying plastic beads, a satisfactory dust-removing rate was confirmed.

INDUSTRIAL APPLICABILITY

The piezoelectric material of the present invention exhibits satisfactory piezoelectric property even at high ambient temperature. The piezoelectric material does not contain lead, and thus, the environmental load thereof is light. Therefore, the lead-free piezoelectric material of the present invention may be used without problems in devices such as a liquid discharge head, an ultrasonic motor, and a dust removing device which use a large amount of a piezoelectric material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-041881, filed Feb. 28, 2011, which is hereby incorporated by reference herein in its entirety.

REFERENCE SIGNS LIST 101 piezoelectric element
102 individual liquid chamber
103 diaphragm
104 liquid chamber partition wall
105 discharge port
106 connecting hole
107 common liquid chamber
108 buffer layer
1011 first electrode
1012 piezoelectric material
1013 second electrode
201 transducer
202 rotor
203 output axis
204 transducer
205 rotor
206 spring
2011 elastic ring
2012 piezoelectric element
2013 organic adhesive
2041 metal elastic body 2042 laminated piezoelectric element
310 dust removing device
320 diaphragm
330 piezoelectric element
331 piezoelectric material
332 first electrode
333 second electrode
336 first electrode surface
337 second electrode surface

The invention claimed is:

1. A piezoelectric material, comprising:
a perovskite-type metal oxide that is represented by general formula (1):

general formula (1), where relationships of x≤y, 0.80≤x≤0.95, and 0.85≤y≤0.95 are satisfied; and
y×0.05 mol % or more to y×2 mol % or less of copper with respect to 1 mol of the perovskite-type metal oxide.

2. A piezoelectric element, comprising:
the piezoelectric material according to claim 1; and
a pair of electrodes provided so as to be in contact with the piezoelectric material.

3. A liquid discharge head, comprising:
a liquid chamber comprising a vibration portion including the piezoelectric element according to claim 2; and
a discharge port communicating with the liquid chamber.

4. An ultrasonic motor, comprising:
a vibration body including the piezoelectric element according to claim 2; and
a moving body that is in contact with the vibration body.

5. A dust removing device, comprising a vibration body including the piezoelectric element according to claim 2.

* * * * *